(12) United States Patent
Nolan et al.

(10) Patent No.: US 11,454,738 B2
(45) Date of Patent: Sep. 27, 2022

(54) RECOMMENDATION ENGINE FOR A COGNITIVE RESERVOIR SYSTEM

(71) Applicant: Beyond Limits, Inc., Glendale, CA (US)

(72) Inventors: Zackary H. Nolan, Los Angeles, CA (US); Shahram Farhadi Nia, Glendale, CA (US)

(73) Assignee: Beyond Limits, Inc., Glendale, CA (US)

( * ) Notice: Subject to any disclaimer, the term of this patent is extended or adjusted under 35 U.S.C. 154(b) by 850 days.

(21) Appl. No.: 16/157,764

(22) Filed: Oct. 11, 2018

(65) Prior Publication Data

US 2019/0107645 A1 Apr. 11, 2019

Related U.S. Application Data

(60) Provisional application No. 62/571,150, filed on Oct. 11, 2017.

(51) Int. Cl.
*G01V 99/00* (2009.01)
*G06N 3/08* (2006.01)
(Continued)

(52) U.S. Cl.
CPC ............ *G01V 99/005* (2013.01); *G06F 30/20* (2020.01); *G06N 3/04* (2013.01); *G06N 3/0436* (2013.01);
(Continued)

(58) Field of Classification Search
CPC ..... G06N 3/0436; G06N 5/048; G01V 99/005
See application file for complete search history.

(56) References Cited

U.S. PATENT DOCUMENTS 11,143,789 B2 10/2021 Golmohammadizangabad
2004/0133531 A1 7/2004 Chen et al.
(Continued)

FOREIGN PATENT DOCUMENTS

WO WO 2016/140645 9/2016
WO WO 2017/079178 5/2017
(Continued)

OTHER PUBLICATIONS

Ouahed et al. (Application of artificial intelligence to characterize naturally fractured zones in Hassi Messaoud Oil Field, Algeria, May 2005, pp. 122-141) (Year: 2005).*
(Continued)

*Primary Examiner* — George Giroux
(74) *Attorney, Agent, or Firm* — Polsinelli LLP

(57) ABSTRACT

Implementations described and claimed herein provide systems and methods for developing a reservoir. In one implementation, a reservoir model is received. The reservoir model includes a static model and a dynamic model. The static model includes one or more clusters of a three-dimensional volume of the reservoir and an uncertainty quantification generated using a neural network. The dynamic model includes pressure values and fluid saturation values propagated across the three-dimensional volume through a nodal connectivity of neighboring clusters. A set of input features is generated from the static model and the dynamic model. The set of input features is related to a drilling attractiveness of a target region of the reservoir using a set of rules executed by a fuzzy inference engine. A quantification of the drilling attractiveness is generated. A recommendation for drilling in the reservoir is output based on the quantification of the drilling attractiveness.

17 Claims, 8 Drawing Sheets

(51) Int. Cl.
*G06N 3/04* (2006.01)
*G06F 30/20* (2020.01)

(52) U.S. Cl.
CPC ............. *G06N 3/0454* (2013.01); *G06N 3/08* (2013.01); *G06N 3/088* (2013.01)

(56) References Cited

U.S. PATENT DOCUMENTS

| | | |
|---|---|---|
| 2006/0285436 A1 | 12/2006 | Mayorga et al. |
| 2009/0020284 A1* | 1/2009 | Graf ........................ E21B 44/00 166/250.15 |
| 2009/0119018 A1 | 5/2009 | Priezzhev et al. |
| 2009/0204377 A1 | 8/2009 | Van Wagoner et al. |
| 2010/0235154 A1 | 9/2010 | Meurer et al. |
| 2011/0002194 A1 | 1/2011 | Imhof et al. |
| 2012/0203525 A1 | 8/2012 | Herrera et al. |
| 2012/0221306 A1 | 8/2012 | Hurley et al. |
| 2013/0124171 A1 | 5/2013 | Schuette et al. |
| 2015/0066460 A1* | 3/2015 | Klinger ................ G01V 99/005 703/2 |
| 2015/0300151 A1* | 10/2015 | Mohaghegh ............ E21B 47/10 702/9 |
| 2015/0347898 A1 | 12/2015 | Hiu et al. |
| 2016/0078345 A1* | 3/2016 | Rajati ...................... G06N 5/04 706/47 |
| 2016/0259088 A1 | 9/2016 | Carvajai et al. |
| 2017/0336811 A1* | 11/2017 | Stone ...................... E21B 43/12 |
| 2018/0188403 A1 | 7/2018 | Halsey et al. |
| 2018/0321421 A1 | 11/2018 | Halabe et al. |
| 2019/0107642 A1 | 4/2019 | Nia |
| 2019/0107643 A1 | 4/2019 | Golmohammadizangabad |
| 2019/0107644 A1 | 4/2019 | Nia |
| 2022/0026598 A1 | 1/2022 | Golmohammadizangabad |

FOREIGN PATENT DOCUMENTS

| | | |
|---|---|---|
| WO | WO 2019/075242 | 4/2019 |
| WO | WO 2019/075245 | 4/2019 |
| WO | WO 2019/075247 | 4/2019 |
| WO | WO 2019/075250 | 4/2019 |

OTHER PUBLICATIONS

Darabi et al. (3D fracture modeling in Parsi oil field using artificial intelligence tools, 2010, pp. 67-76) (Year: 2010).*
PCT Application No. PCT/US2018/055471 International Preliminary Report on Patentability dated Apr. 14, 2020.
PCT Application No. PCT/US2018/055475 International Preliminary Report on Patentability dated Apr. 14, 2020.
PCT Application No. PCT/US2018/055477 International Preliminary Report on Patentability dated Apr. 14, 2020.
PCT Application No. PCT/US2018/055480 International Preliminary Report on Patentability dated Apr. 14, 2020.
PCT Application No. PCT/US2018/055471 International Search Report and Written Opinion dated Jan. 7, 2019.
PCT Application No. PCT/US2018/055477 International Search Report and Written Opinion dated Jan. 7, 2019.
PCT Application No. PCT/US2018/055480 International Search Report and Written Opinion dated Dec. 31, 2018.
PCT Application No. PCT/US2018/055475 International Search Report and Written Opinion dated Feb. 5, 2019.
U.S. Appl. No. 16/157,716, Shahram F. Nia, System for Improved Reservoir Exploration and Production, filed Oct. 11, 2018.
PCT/US18/55471, System for Improved Reservoir Exploration and Production, dated Oct. 11, 2018.
U.S. Appl. No. 16/157,732, Azarang Golmohammadizangabad, Static Engine and Neural Network for a Cognitive Reservoir System, filed Oct. 11, 2018.
PCT/US18/55475, Static Engine and Neural Network for a Cognitive Reservoir, dated Oct. 11, 2018.
U.S. Appl. No. 16/157,757, Shahram F. Nia, Dynamic Engine for a Cognitive Reservoir System, filed Oct. 11, 2018.
PCT/US18/55477, Dynamic Engine for a Cognitive Reservoir System, dated Oct. 11, 2018.
PCT/US18/55480, Recommendation Engine for a Cognitive Reservoir System, dated Oct. 11, 2018.
U.S. Appl. No. 17/497,477, Azarang Golmohammadizangabad, Static Engine and Neural Network for a Cognitive Reservoir, filed Oct. 8, 2021.
U.S. Appl. No. 16/157,757 Office Action dated Jan. 19, 2022.
U.S. Appl. No. 16/157,716 Office Action dated Jul. 14, 2021.
U.S. Appl. No. 16/157,732 Office Action dated Jan. 4, 2021.

* cited by examiner

RECOMMENDATION ENGINE FOR A COGNITIVE RESERVOIR SYSTEM

CROSS-REFERENCE TO RELATED APPLICATIONS

The present application claims benefit under 35 U.S.C. § 119 to U.S. Provisional Patent Application No. 62/571,150, entitled "Techniques for Improved Reservoir Exploration and Production" and filed Oct. 11, 2017, which is specifically incorporated by reference in its entirety herein.

TECHNICAL FIELD

Aspects of the present disclosure relate to exploration, evaluation, development, and production of a reservoir, and more particularly to systems and methods for identifying target regions of a reservoir having a high probability of production.

BACKGROUND

A reservoir is subsurface pool of a natural resource, such as oil and/or gas, contained within rock formations, which have varying levels of porosity and permeability. The porosity is dictated by a volume of the natural resource and the pore volume of the rock, while the permeability relates to the ability of the rock to allow the natural resource to flow through for collection. Reservoirs are identified using hydrocarbon exploration techniques that involve drilling along a well trajectory. Well logs are a concise, detailed plot of formation parameters versus depth that are captured using logging tools deployed along the well trajectory. Using the well logs, professionals may identify lithologies, differentiate between porous and nonporous rock, and identify pay-zones in the subsurface rock formations where the natural resource exists in exploitable quantities.

However, while characteristics of the petrophysical phenomena, including porosity and permeability, along the well trajectory may be known, uncertainty of the petrophysics of the subformation increases as distance away from the well trajectory increases. Accordingly, reservoir modeling is utilized to estimate the petraphysics for use in decision making regarding field development, future production prediction, well placement, and other reservoir production activities. Conventionally, a suite of professionals are involved in gathering the data, generating the model, and employing the model in decision making. Each of these professionals is typically utilizing a discrete tool that outputs results dictated by underlying assumptions by the professional and handing off the results to another professional to use in the next step. As such, the end to end process is conventionally plagued with human error and bias in the results generated by each tool with no retention of the disparate professional opinions that were presented during the discrete processes but rejected. In addition to human error and bias influencing the results, conventional systems and methods have inconsistent workflows and inefficient handoffs and fail to integrate the discrete tools with disparate programming languages and to retain alternative opinions, assumptions, and underlying data. Overall, conventional systems and methods fail to meaningfully reduce uncertainty and risk in reservoir exploration, evaluation, development, and production. It is with these observations in mind, among others, that various aspects of the present disclosure were conceived and developed.

SUMMARY

Implementations described and claimed herein address the foregoing problems by providing systems and methods for developing a reservoir. In one implementation, a reservoir model is received at a fuzzy inference engine. The reservoir model includes a static model and a dynamic model. The static model includes one or more clusters of a three-dimensional volume of the reservoir and an uncertainty quantification generated using a neural network. The dynamic model includes pressure values and fluid saturation values propagated across the three-dimensional volume through a nodal connectivity of neighboring clusters. A set of one or more input features is generated from the static model and the dynamic model using the fuzzy inference engine. The set of one or more input features is related to a drilling attractiveness of a target region of the reservoir using a set of one or more rules executed by a fuzzy inference engine. A quantification of the drilling attractiveness is generated. A recommendation for drilling in the reservoir is output based on the quantification of the drilling attractiveness.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

Aspects of the present disclosure involve systems and methods for the characterization and exploitation of a reservoir using artificial intelligence techniques. Generally, a reservoir development system is an end to end automated system permitting local expertise to be injected into a series of modular processes with a handoff between the modular processes conducted through a common integration platform. The reservoir development system thus provides an integration platform for numerous data-driven, physics-based, expertise and policy elements to determine where to drill in the reservoir with a justification for which the underlying reasoning may be traced. To arrive at the decision of where to drill, the reservoir development system generates a static model comprising a geological representation of the reservoir. The reservoir development system quantifies uncertainty in the static model and considers risk in the reasoning. From the static model, the reservoir development system generates a dynamic model of the reservoir, which analyzes the aspects of the reservoir that change over time through a graph representation. Using the dynamic model, the reservoir development system provides a ranking of target volumes for drilling with supporting information in relative and absolute terms detailing how the ranking was produced. If any of the underlying information changes, the reservoir development system may provide real time reranking. Overall, the reservoir development system reduces human bias and error, provides a consistent workflow, facilitates handoffs, retains alternative opinions and supporting information, addresses uncertainty, and accommodates changes to the supporting information. These benefits, among others, will be apparent from the present disclosure.

Figure 1:
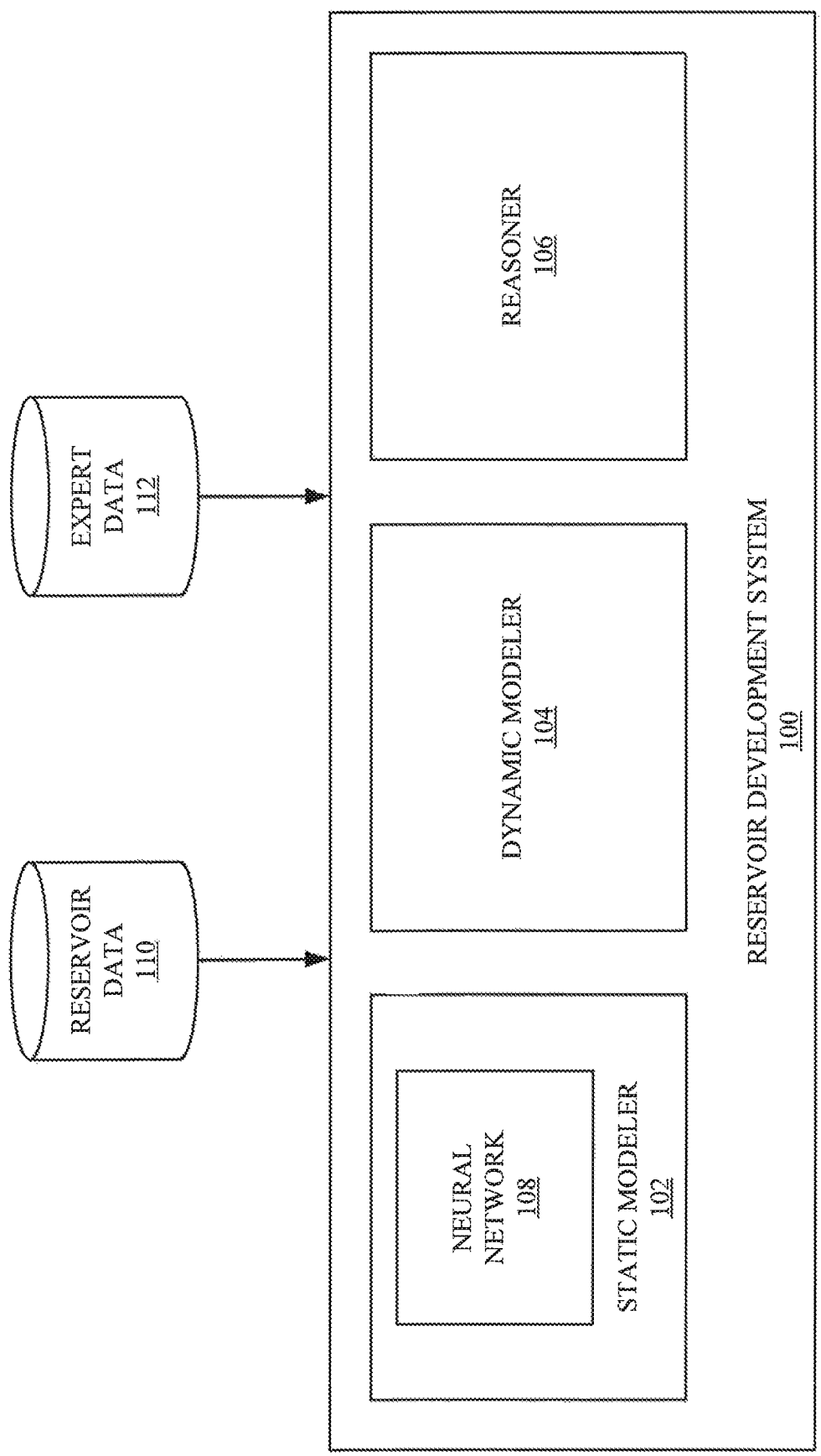
FIG. 1 illustrates an example reservoir development system including a static modeler, a dynamic modeler, and a reasoner.

To begin a detailed description of an example reservoir development system 100, reference is made to FIG. 1. In one implementation, the reservoir development system 100 incorporates data into an integrated model of a probable, true state of a reservoir and provides an assessment of one or more target regions of the reservoir having a high probability of production. The reservoir development system 100 expedites multi-disciplinary collaboration in an integrated platform. More particularly, the reservoir development system 100 integrates multi-physics data, diverse-expertise input and policies. Using various machine learning techniques, the reservoir development system 100 quantifies uncertainty and provides an automatic configuration and reconfiguration of plumbing of the reservoir. The reservoir development system 100 generates a model of the reservoir and reduces the model and underlying data to symptoms for one or more target regions of the reservoir. A ranking of these target regions is output by the reservoir development system 100 to a user device for interaction by a user via a user interface. An explanation of the rankings and decisions made during the process forming the basis of the rankings may be provided via the user interface. Overall, the reservoir development system 100 provides an expedited testing and analysis of hypotheses to identify target regions.

In one implementation, the reservoir development system 100 includes a static modeler 102, a dynamic modeler 104, and a reasoner 106. The static modeler 102 generates a static model of the reservoir using a neural network 108 while quantifying uncertainty, and the dynamic modeler 104 generates a dynamic model of the reservoir using the static model. Based on the dynamic model, the reasoner 106 generates a ranking of target regions for drilling with supporting information in relative and absolute terms detailing how the ranking was produced.

The reservoir development system 100 receives and digests data from one or more sources. In one implementation, the data includes reservoir data 110 captured using one or more measuring tools deployed at a reservoir and expert data 112 including reservoir data having one or more attributes expertly labeled by a professional. Any changes to the expert labels of the same attribute may be retained and stored in a database for subsequent access and analysis.

In one implementation, the reservoir data 110 includes, without limitation, field data and well data. The field data may include four-dimensional (4D) seismic data, which incorporates a plurality of time-lapsed three-dimensional (3D) subsurface images portraying changes in the reservoir over time. The well data includes various information captured about one or more wells at the reservoir and may include, without limitation, well name, well trajectories, well logs, completions, production, pressure, and/or the like. Each of the well trajectories is a path along which a well is drilled at the reservoir. Well logs are a concise, detailed plot of formation parameters versus depth that are captured using logging tools deployed along the well trajectory. The well logs may include gamma ray (GR), neutron porosity sandstone matrix (NPSS), bulk density (RhoB), deep resistivity (RDEEP), and/or the like. The completions may include perforation intervals, and the production may include oil production, gas production, and/or water production. The pressure may include buildup.

The expert data 112 may include, without limitation, expertly labeled seismic data, expertly labeled well logs, OWCS, and/or the like. The expertly labeled seismic data may include fault data and/or surface data, and the expertly labeled well logs may include permeability, porosity, and/or the like. The expert data 112 may include the same data labeled by a plurality of experts with commonalities and differences of attributes labeled by the experts tracked and stored.

In one implementation, the static modeler 102 receives static data of the reservoir data 110 and the expert data 112, and utilizing a chain of supervised and unsupervised machine learning algorithms, the static modeler 102 realizes a static characterization of the reservoir while quantifying uncertainty. More particularly, the static modeler 102 receives well logs and well trajectory data, including a set of observed data points (with x, y, and z coordinates for each measurement) in a volume along a well trajectory. Using the well logs and the well trajectory data, the neural network 108 of the static modeler 102 generates 3D populated logs across a volume of the reservoir.

Uncertainty increases with distance away from the well trajectory where volumetric density of information is lower. As such, the static modeler 102 quantifies uncertainty using the neural network 108. In one implementation, the static modeler 102 generates n random points in 3D space. For each of the observed data points in the well trajectory data, the static modeler 102 generates a set of feature vectors based on a distance between the observed data point and each of the random points. Each feature vector includes corresponding log values from the well logs. The neural network 108 is trained with the feature vectors and propagates the values across the volume of the reservoir to generate a 3D populated log. The source of the uncertainty is the n random points. To address this uncertainty, the static modeler 102 changes the random points, which changes the training data for the neural network 108 and thus the 3D populated log generated by the neural network 108. As such, the neural network 108 generates a plurality of 3D populated log realizations that are each different and equally probable.

In one implementation, the static modeler 102 generates static log values, including permeability, porosity, initial water saturation, and/or the like, from the 3D populated log realizations. More particularly, the static log values are generated using a k-nearest neighbors algorithm, using an average of the different 3D populated log realizations. The k-nearest neighbors algorithm is thus performed over many instances for each of NPSS, RhoB, GR, and RDEEP. Petrophysicist assigned rock properties, including porosity and permeability, may further be utilized.

From the static log values, the static modeler 102 generates a static model of the reservoir by clustering the reservoir into one or more rock types. In one implementation, the static model is generated through k-means clustering, which partitions n observations into k clusters in which each observation belongs to the cluster with the nearest mean. The clusters of the static model obtained through the k-means clustering includes NPSS, RhoB, GR, and RDEEP values at each voxel of the 3D representation.

In one implementation, the static modeler 102 receives seismic data, which may be expertly labeled and include surfaces of one or more layers of the reservoir (e.g., three different layers) and fault data, including fault polygons. From the seismic data, the static modeler 102 generates fault planes through 3D plane fitting to add faults to the clusters of the static model. The static modeler is thus a static characterization of the reservoir that quantifies uncertainty.

In one implementation, the dynamic modeler 104 receives the static model from the static modeler 102 and time dependent data for the reservoir. Generally, the dynamic modeler 104 utilizes semi-supervised artificial intelligence to build higher order connectivity relationships among static regions according to applied physics. Stated differently, the dynamic modeler 104 represents the static model as a graph and enables integration of different data-derived attributes as well as fundamental physics of flow in porous media.

In one implementation, the dynamic modeler 104 receives clusters of rock types from the static model and constructs a reservoir graph representing the clusters as graph vertices. The vertex properties of graph representation of the static model includes location (x, y, z), porosity, pore volume, permeability, and initial oil saturation. Each vertex is defined to contain a spatially continuous voxel set. The dynamic model 104 defines graph connectivity through nodal connectivity of neighboring clusters. The graph may be updated automatically with new fault planes, which act as nodes with zero or reduced permeability. The faults change the connectivity across the domain. Low confidence faults that are identified a number of times below a threshold may be removed. The dynamic modeler 104 transforms the static model into nodes including fault effects and defines the connectivity.

In one implementation, the dynamic modeler 104 estimates pressure using the connectivity. The nodes with high connectivity are more likely to have similar pressures. Continuity in reservoir fluids allows for propagating pressure from observation points across the 3D network. The areas with no connectivity to the observation points are considered uncertain in pressure values. As such, when a new pressure point becomes available, the dynamic modeler 104 propagates the new pressure point across the volume, as it might represent an isolated section of the reservoir. The dynamic modeler 104 utilizes the connectivity in the 3D structure to propagate pressure observations. The dynamic modeler 104 receives 4D seismic data from which the dynamic modeler 104 determines fluid saturation across the reservoir. From the graph construction of the static model, the pressure, and the fluid saturation, the dynamic modeler 104 generates a dynamic model of the reservoir.

Figure 2:
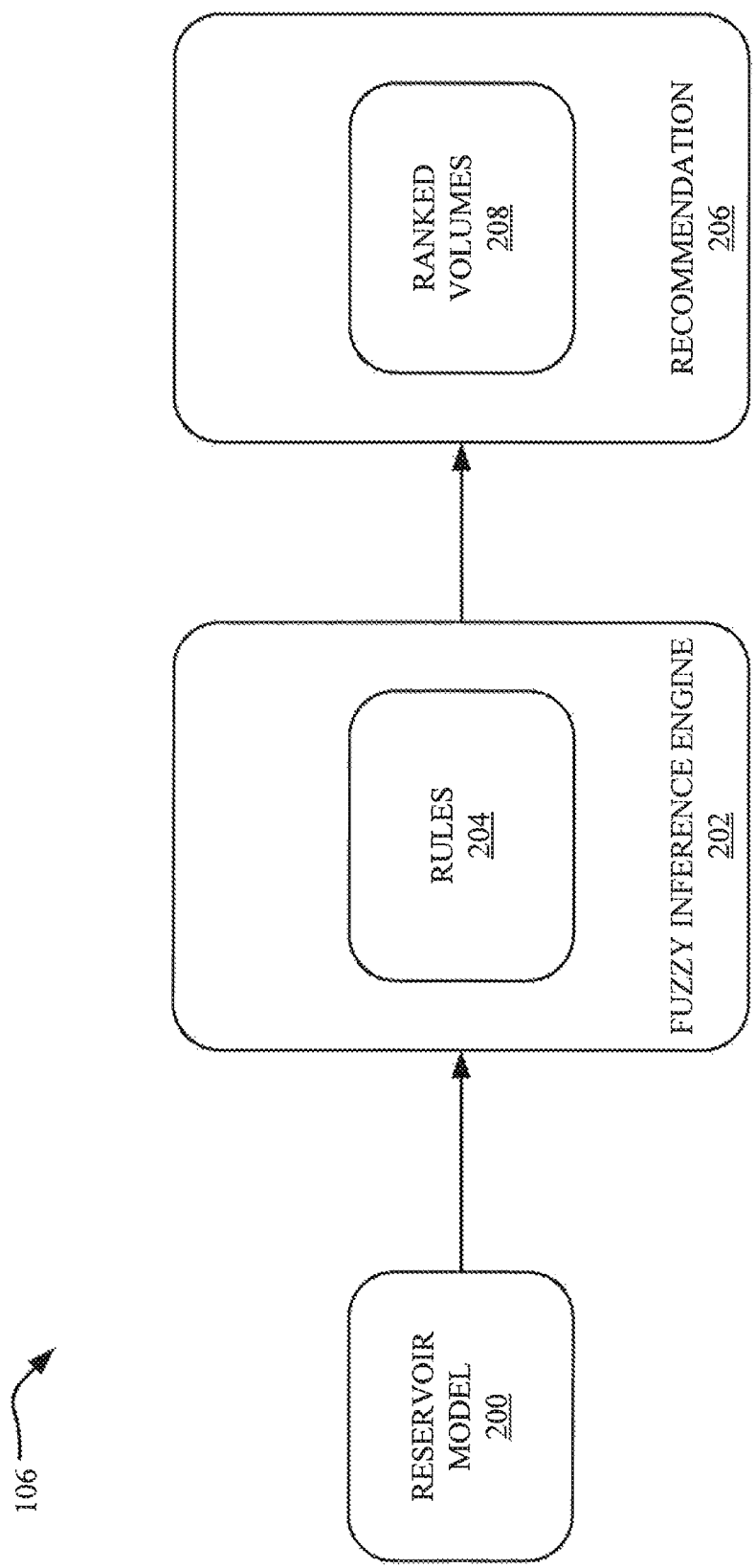
FIG. 2 illustrates an example reasoner of the reservoir development system.

The dynamic model may be augmented with additional data sources and updated over time, for example, as the pressure and/or the saturation changes. Further, modular properties may be ascribed to the dynamic model for interpretation by the reasoner 106. The static modeler 102 and the dynamic modeler 104 reduce integration time between static and dynamic data, facilitate assimilation of pressure and saturation observations, and expedite construction of 3D plumbing of the reservoir. As can be understood from FIGS. 1-2, in one implementation, the reasoner 106 utilizes a reservoir model 200, including the static model and/or the dynamic model, to rank sub-volumes of the reservoir as potential target regions for drilling.

In one implementation, the reasoner 106 includes a fuzzy inference engine 202 that generates a recommendation 206 by reasoning over the underlying reservoir model 200 and evaluating target volumes against a set of one or more rules 204. The fuzzy inference engine 202 may perform one or more stages of fuzzy inference.

Generally, fuzzy logic is a many-value logic that contrary to binary logic, where truth (i.e., a consistency with a proposition) is represented strictly with a 0 or 1 (i.e., true or false), models truth as a continuum with 0 and 1 being the boundaries. Within this context, in one implementation, the reasoner 106 may generate a set of one or more input features computable from the static model and the dynamic model. For example, the set of features may include 24 features, such as a distance to aquifer, short term connected oil volume, long term accessible energy, and/or the like. The reasoner 106 utilizes the set of rules 204 relating the values of the set of features to a drilling attractiveness of a node, which is quantified for ranking. For example, if energy is high and connected water volume is low and connected oil volume is high and connected oil volume uncertainty is low, then drilling attractiveness is high. Similarly, if short term accessible energy is high and medium term accessible energy is high and long term accessible energy is high, then energy is high. As another example, if distance to aquifer is high then drilling attractiveness is high.

In binary logic, being characterized as high, would necessarily equate to the value being strictly true, with low being false. Conversely, the fuzzy inference engine 202 models high as a continuum where what is meant by high could be interpreted as highest (i.e., equal to 1), higher than some (i.e., greater than 0 but less than 1), and/or the like. As such, high, low, medium, etc. as used herein as linguistic variables. A linguistic variable is a term that indexes a particular part of a value spectrum. The fuzzy inference engine 202 maps the input features into the linguistic variables according to a membership function. This mapping carries an absolute value into an interpretation for high, low, medium, etc., which is then used to evaluate a corresponding rule. In one implementation, the membership functions utilized by the fuzzy inference engine 202 are based on a trapezoidal structure where minimum and maximum values are computed in light of an absolute minimum value and an absolute maximum value for each category examined for the reservoir.

From one reservoir to the next, an absolute volume of connected oil in a node may vary considerably. The reasoner 106 thus determines how any of the nodes in a particular reservoir compare to others with respect to a value of interest. As such, the membership functions utilized by the fuzzy inference engine 202 are fit to the intervals that emerge for a particular reservoir, with high at least including a particular maximum value and low at least including a particular minimum value as computed over all nodes in the particular reservoir. For example, if there are three nodes in a system having energy values {10, 20, 50}, the membership functions are overlaid on the interval {10, 50}, allowing the reasoner 106 to achieve an interpretation of which nodes are most attractive to drill relative to the others.

In one implementation, the recommendation 206 generated by the reasoner 106 includes ranked volumes 208 where potential target regions for drillings are ranked in a list. For each of the rankings in the ranked volumes 208, the reasoner 106 provides an audit trail detailing, in relative and/or absolute terms, how the ranking was produced. In one implementation, the reasoner 106 generates the audit trail according to the nature of how the set of rules is encoded in the policy. More particularly, the policy encodes a hierarchy of if/then rules. At each step in the hierarchical inference process, the reasoner 106 caches an input value of the input feature and an evaluation of the current rule in terms of the computed membership functions. Proceeding in a forward direction, the reasoner 106 reduces all the evaluations into a single quantified result. At this point, the reasoner 106 built a tree of what was evaluated. The audit trail thus includes the tree, which is traversable in the backward direction to analyze the underlying data and logic.

The reasoner 106 further monitors the static modeler 102 and the dynamic modeler 104 for updates, including new inputs and/or changes. If the reasoner 106 detects any updates, the reasoner 106 generates a reranking of the target regions to updated the ranked volumes 208 in real time.

Stated differently, in one implementation, the reasoner 106 executes a policy of the set of rules 204 defining desirable and undesirable volume features, and the reasoner 106 combines values for different categories hierarchically to produce an aggregate score for each of the ranked volumes 208. The ranked volumes 208 include each of the target regions ranked in a list according to the aggregate scores. As such, the ranked volumes 208 are quantitative ratings, which are output as a user interface that a user may interact with using a user device to inspect the underlying rationale of the rankings to identify target regions for drilling.

In one implementation, a reservoir graph is generated from the static model and injected with time dependent data. The reservoir graphs may have various nodal properties, graph traversal attributes, and/or the like. For example, the nodal properties may include, without limitation, vertex, vertex location, porosity, pre volume, permeability, vertex height, water saturation, static uncertainty, list perforations, fault, fault confidence, shale, aquifer, adjacent vertices, edge weights, time distance, boundary central voxel, shared area neighbors, pressure, and/or the like. The graph traversal attributes may include, without limitation, sorted path index, sorted path time, distance to aquifer, transmissibility, short term connected oil volume, cumulative production of short term interfering wells, short term accessible energy, short term connected water volume, short term connected oil volume uncertainty, medium term connected oil volume, cumulative productions of medium term interfering wells, medium term accessible energy, medium term connected water volume, medium term connected oil volume uncertainty, long term connected oil volume, cumulative production of long term interfering wells, long term accessible energy, long term connected water volume, long term connected oil volume uncertainty, number of nearby faults, average connectivity of nearby faults, average confidence of nearby faults, number of midway faults, average connectivity of midway faults, average confidence of midway faults, number of distant faults, average connectivity of distant faults, average confidence of distant faults, and/or the like. The reasoner 106 may utilize these attributes in generating the ranked volumes.

Figure 3:
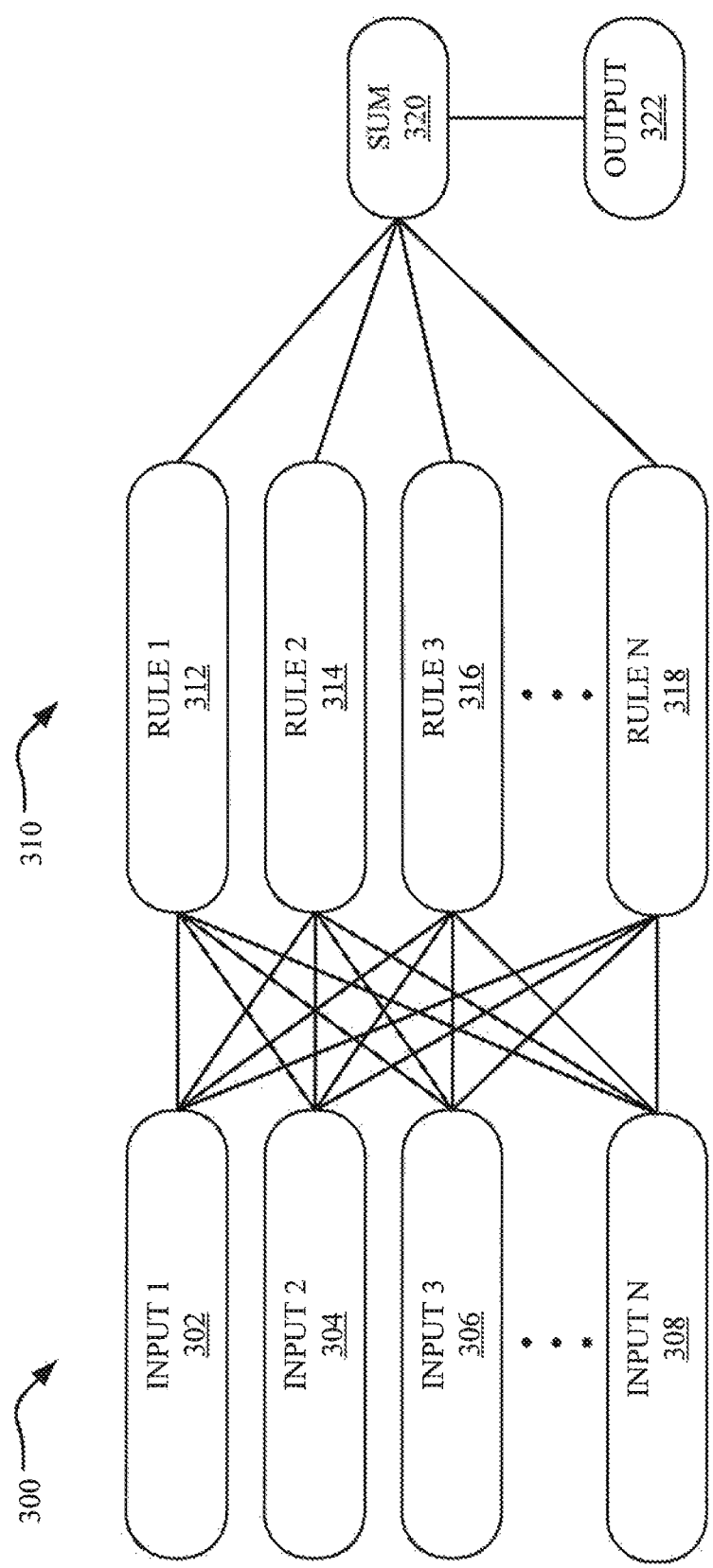
FIG. 3 illustrates a fuzzy inference policy to generate recommendations.

Turning to FIG. 3, in one implementation, the fuzzy inference engine 202 utilizes a policy defining desirable and undesirable volume features through an input set 300 and a rule set 310, and the fuzzy inference engine 202 combines values for different categories hierarchically to produce an aggregate score 320 for each of the volumes and an output 322. The fuzzy inference engine 202 may perform one or more stages of fuzzy inference, such that the output 322 may be an intermediary value or a final value, each being quantified between 0 and 1. In one implementation, the final output is a drilling attractiveness value between 0-1, from which each of the target regions may be ranked in a list.

In one implementation, the input set 300 includes one or more inputs 302-308 for various features, each carrying a value attribute. The one or more inputs 302-308 may be computable from the reservoir model 200. The rule set 310 similarly includes one or more rules 312-318 relating the values attributes of the inputs 302-308 to a drilling attractiveness of a node for combining hierarchically to produce the aggregate score 320. Based on the score 320, the output 322 is generated.

Figure 4:
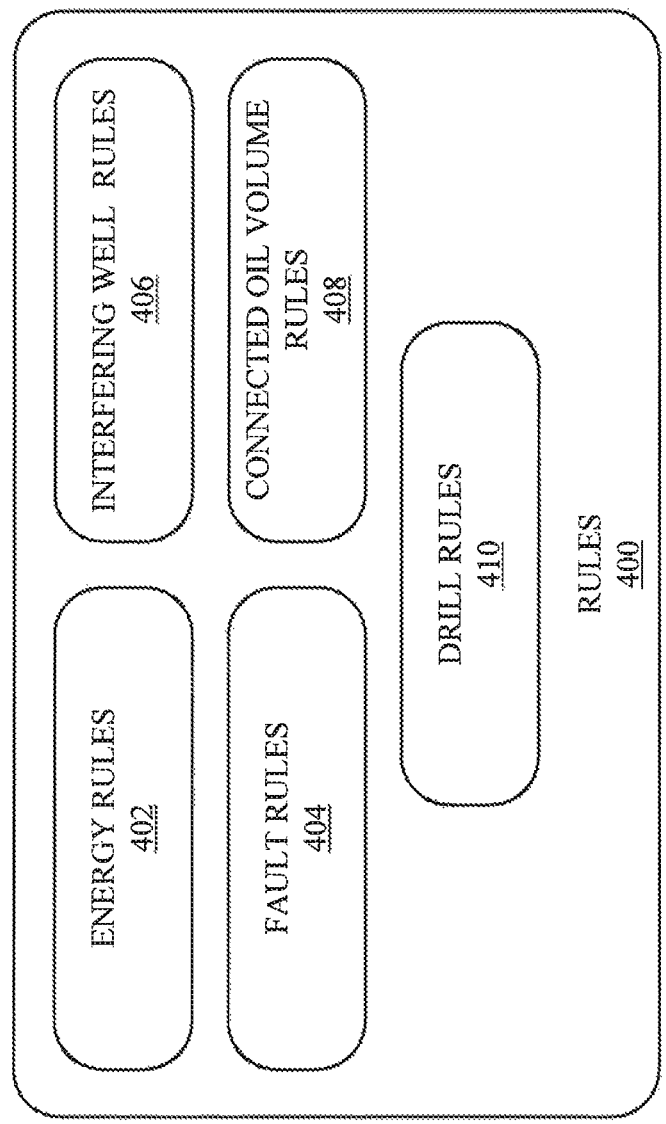
FIG. 4 shows a set of rules for a two stage fuzzy inference policy.

Turning to FIG. 4, in one implementation, the fuzzy inference engine 202 performs analyzes a rule policy 400 comprising two stages of fuzzy inference with the rule set 310 including energy rules 402, fault rules 404, interfering well rules 406, connected oil volume rules 408, and drill rules 410 that are used in reasoning over the input set 300 to obtain the aggregated score 320 and two stages of outputs 322. More particularly, a first stage of fuzzy inference provides output energy, output faults, output interfering wells, and output connected oil volume, and a second stage of fuzzy inference provides an output of drill attractiveness from the outputs of the first stage.

In one implementation, the input set 300 corresponding to the energy rules 402 includes long term connected water volume, mid term connected water volume, short term connected water volume, long term accessible energy, mid term accessible energy, and short term accessible energy. The energy rules 402 includes a set of more or more of the rules 312-318 corresponding to these inputs 302-308. In one implementation, the rules 312-318 include, without limitation: a first rule that if short term connected water volume is low and long term connected water volume is high, then energy is high; a second rule that if short term connected water volume is high and long term connected water volume is high, then energy is medium; a third rule that if long term accessible energy is high, then energy is medium; and a fourth rule that if long term connected water volume is high or long term accessible energy is high, then energy is medium. It will be appreciated that more, fewer, and/or different inputs and/or rules may be utilized. The energy rules 402 are aggregated into the score 320 and the output 322 is an intermediary output of output energy with a value quantified between 0-1.

The input set 300 corresponding to the fault rules 404 may include nearby faults, midway faults, distant faults, nearby fault transmissibility, midway fault transmissibility, distant fault transmissibility, and fault confidence. The fault rules 404 includes a set of more or more of the rules 312-318 corresponding to these inputs 302-308. In one implementation, the rules 312-318 include, without limitation: a first rule that if nearby faults is medium, nearby fault transmissibility is high, and fault confidence is high, then faults is high; a second rule that if nearby faults is medium, nearby fault transmissibility is low, and fault confidence is low, then faults is medium; a third rule that if midway faults is high, midway fault transmissibility is low, and fault confidence is high, then faults is medium; and a fourth rule that if nearby faults is high, nearby fault transmissibility is high, and fault confidence is medium, then faults is low. It will be appreciated that more, fewer, and/or different inputs and/or rules may be utilized. The fault rules 404 are aggregated into the score 320 and the output 322 is an intermediary output of output faults with a value quantified between 0-1.

In one implementation, the input set 300 corresponding to the interfering well rules 406 includes initially interfering wells, long term interfering wells, medium term interfering wells, short term interfering wells, production of long term interfering wells, production of medium term interfering wells, and production of short term interfering wells. The interfering well rules 406 includes a set of more or more of the rules 312-318 corresponding to these inputs 302-308. In one implementation, the rules 312-318 include, without limitation: a first rule that if initially interfering wells is low, long term interfering wells is low, and production of long term interfering wells is low, then interfering wells is low; a second rule that if initially interfering wells is high, long term interfering wells is low, and production of long term interfering wells is low, then interfering wells is medium; and third rule that if medium term interfering wells is medium and production of long term interfering wells is medium, then interfering wells is high; and a fourth rule that if short term interfering wells is medium, long term interfering wells is medium, and production of long term interfering wells is low, then interfering wells is medium. It will be appreciated that more, fewer, and/or different inputs and/or rules may be utilized. The interfering wells rules 406 are aggregated into the score 320 and the output 322 is an intermediary output of output interfering wells with a value quantified between 0-1.

In one implementation, the input set 300 corresponding to the connected oil volume rules 408 includes long term connected oil volume, medium term connected oil volume, short term connected oil volume, long term connected oil volume uncertainty, medium term connected oil volume uncertainty, and short term connected oil volume uncertainty. The connected oil volume rules 408 includes a set of more or more of the rules 312-318 corresponding to these inputs 302-308. In one implementation, the rules 312-318 include, without limitation: a first rule that if long term connected oil volume is high and long term connected oil volume uncertainty is low, the connected oil volume is high; a second rule that if short term connected oil volume is high and long term connected oil volume is low, the connected oil volume is medium; a third rule that if medium term connected oil volume is high and long term connected oil volume uncertainty is medium, the connected oil volume is medium; and a fourth rule that if long term connected oil volume is low and long term connected oil volume uncertainty is medium, then connected oil volume is low. It will be appreciated that more, fewer, and/or different inputs and/or rules may be utilized. The connected oil volume rules 408 are aggregated into the score 320 and the output 322 is an intermediary output of output connected oil volume with a value quantified between 0-1.

Finally, after the first stage of fuzzy inference is completed and the output energy, output faults, output interfering wells, and output connected oil volumes are obtained, the second stage of fuzzy inference is performed to obtain the final output of drill attractiveness. In one implementation, the input set 300 corresponding to the drill rules 410 includes output energy, output faults, output interfering wells, output connected oil volumes, transmissibility, and static property confidence. The drill rules 410 includes a set of more or more of the rules 312-318 corresponding to these inputs 302-308. In one implementation, the rules 312-318 include, without limitation: a first rule that if energy is high, faults is low, and connected oil volumes is high, then drill attractiveness is high; a second rule that if energy is high, connected oil volume is high, and static property confidence is high, then drill attractiveness is very high; a third rule that if energy is medium, faults is low, and connected oil volume is medium, then drill attractiveness is medium; and a fourth rule that if connected oil volume is low, then drill attractiveness is very low. It will be appreciated that more, fewer, and/or different inputs and/or rules may be utilized. The drill rules 410 are aggregated into the score 320 and the output 322 is a final output of output drill attractiveness with a value quantified between 0-1.

Figure 5:
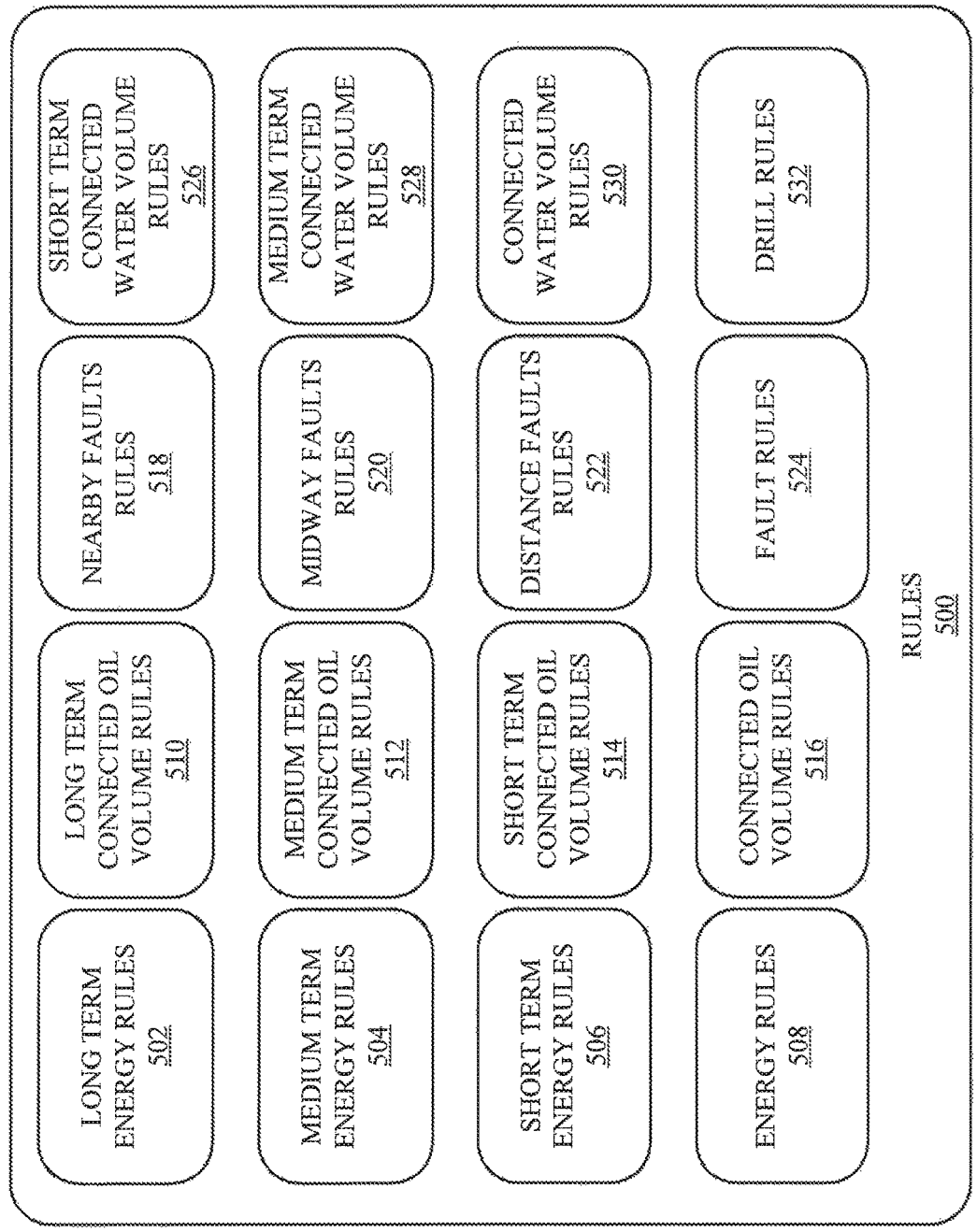
FIG. 5 shows a set of rules for a three stage fuzzy inference policy.

Referring to FIG. 5, in one implementation, the fuzzy inference engine 202 analyzes a rule policy 500 comprising three stages of fuzzy inference with the rule set 310 including long term energy rules 502, medium term energy rules 504, short term energy rules 506, energy rules 508, long term connected oil volume rules 510, medium term connected oil volume rules 512, short term connected oil volume rules 514, connected oil volume rules 516, nearby fault rules 518, midway fault rules 520, distance fault rules 522, fault rules 524, short term connected water volume rules 526, medium term connected water volume rules 528, connected water volume rules 530, and drill rules 532 that reason over the input set 300 to obtain the aggregated score 320 and three stages of outputs 322.

More particularly, a first stage of fuzzy inference provides output long term energy, output medium term energy, output short term energy, output long term connected oil volume, output medium term connected oil volume, output short term connected oil volume, output nearby faults, output midway faults, output distance faults, output short term connected water volume, output medium term connected water volume, output nearby fault transmissibility, and output long term interfering wells. A second stage of fuzzy inference provides output energy, output faults, output interfering wells, output connected water volume, and output connected oil volume. A third stage of fuzzy inference provides an output of drill attractiveness from the outputs of the previous stages.

In one implementation, the input set 300 corresponding to the long term energy rules 502 includes long term connected water volume (LTCWV) and long term accessible energy (LTAE). The long term energy rules 502 includes a set of more or more of the rules corresponding to these inputs. In one implementation, the rules include, without limitation: a first rule that if LTCWV is high and LTAE is high, then Long Term Energy is high; a second rule that if LTCWV is high and LTAE is medium, then Long Term Energy is medium; a third rule that if LTCWV is high and LTAE is low, then Long Term Energy is medium; a fourth rule that if LTCWV is medium and LTAE is high, then Long Term Energy is medium; a fifth rule that if LTCWV is medium and LTAE is medium, then Long Term Energy is medium; a sixth rule that if LTCWV is medium and LTAE is low, then Long Term Energy is low; a seventh rule that if LTCWV is low and LTAE is high, then Long Term Energy is medium; and eighth rule that if LTCWV is low and LTAE is medium, then Long Term Energy is low; and a ninth rule that if LTCWV is low and LTAE is low, then Long Term Energy is low. It will be appreciated that more, fewer, and/or different inputs and/or rules may be utilized. The long term energy rules 502 are aggregated into the score 320 and the output 322 is an intermediary output of output long term energy with a value quantified between 0-1.

The input set 300 corresponding to the medium term energy rules 504 includes cumulative production of medium term interfering wells (CPMTIW) and medium term accessible energy (MTAE). The medium term energy rules 504 includes a set of more or more of the rules corresponding to these inputs. In one implementation, the rules include, without limitation: a first rule that if CPMTIW is low and MTAE is high, then Medium Term Energy is high; a second rule that if CPMTIW is low and MTAE is medium, then Medium Term Energy is medium; a third rule that if CPMTIW is low and MTAE is low, then Medium Term Energy is medium; a fourth rule that if CPMTIW is medium and MTAE is high, then Medium Term Energy is medium; a fifth rule that if CPMTIW is medium and MTAE is medium, then Medium Term Energy is medium; a sixth rule that if CPMTIW is medium and MTAE is low, then Medium Term Energy is low; a seventh rule that if CPMTIW is high and MTAE is high, then Medium Term Energy is medium; an eight rule that if CPMTIW is high and MTAE is medium, then Medium Term Energy is low; and a ninth rule that if CPMTIW is high and MTAE is low, then Medium Term Energy is low. It will be appreciated that more, fewer, and/or different inputs and/or rules may be utilized. The medium term energy rules 504 are aggregated into the score 320 and the output 322 is an intermediary output of output medium term energy with a value quantified between 0-1.

Similarly, the input set 300 corresponding to the short term energy rules 506 includes cumulative production of short term interfering wells (CPSTIW) and short term accessible energy (STAE). The short term energy rules 506 includes a set of more or more of the rules corresponding to these inputs. In one implementation, the rules include, without limitation: a first rule that if CPSTIW is low and STAE is high, then Short Term Energy is high; a second rule that if CPSTIW is low and STAE is medium, then Short Term Energy is medium; a third rule that if CPSTIW is low and STAE is low, then Short Term Energy is medium; a fourth rule that if CPSTIW is medium and STAE is high, then Short Term Energy is medium; a fifth rule that if CPSTIW is medium and STAE is medium, then Short Term Energy is medium; a sixth rule that if CPSTIW is medium and STAE is low, then Short Term Energy is low; a seventh rule that if CPSTIW is high and STAE is high, then Short Term Energy is medium; an eighth rule that if CPSTIW is high and STAE is medium, then Short Term Energy is low; and a ninth rule that if CPSTIW is high and STAE is low, then Short Term Energy is low. It will be appreciated that more, fewer, and/or different inputs and/or rules may be utilized. The short term energy rules 506 are aggregated into the score 320 and the output 322 is an intermediary output of output short term energy with a value quantified between 0-1.

At a second stage of fuzzy inference, the input set 300 corresponding to the energy rules 508 includes long term energy (LTE), medium term energy (MTE), and short term energy (STE) obtained from the first stage of fuzzy inference using the rules 502-506. The energy rules 508 includes a set of more or more of the rules corresponding to these inputs. In one implementation, the rules include, without limitation: a first rule that if STE is low and LTE is high, then Energy is high; a second rule that if STE is low and LTE is medium, then Energy is medium; a third rule that if STE is low and LTE is low, then Energy is low; a fourth rule that if MTE is low and LTE is not high, then Energy is low; a firth rule that if MTE is not low and LTE is not low, then Energy is medium; a sixth rule that if MTE is high and STE is high, then Energy is medium; and a seventh rule that if MTE is not high and STE is not high, then Energy is low. It will be appreciated that more, fewer, and/or different inputs and/or rules may be utilized. The energy rules 508 are aggregated into the score 320 and the output 322 is an intermediary output of output energy with a value quantified between 0-1.

In one implementation, at a first stage of fuzzy inference, the input set 300 corresponding to the long term connected oil volume rules 510 includes long term connected oil volume (LTCOV) and long term connected oil volume uncertainty (LTCOVU). The long term connected oil volume rules 510 includes a set of more or more of the rules corresponding to these inputs. In one implementation, the rules include, without limitation: a first rule that if LTCOV is high and LTCOVU is low, then Long Term Connected Oil Volume is high; a second rule that if LTCOV is high and LTCOVU is medium, then Long Term Connected Oil Volume is medium; a third rule that if LTCOV is medium and LTCOVU is low, then Connected Oil Volume is medium; and a fourth rule that if LTCOV is medium and LTCOVU is high, then Long Term Connected Oil Volume is low. It will be appreciated that more, fewer, and/or different inputs and/or rules may be utilized. The long term connected oil volume rules 510 are aggregated into the score 320 and the output 322 is an intermediary output of output long term connected oil volume with a value quantified between 0-1.

The input set 300 corresponding to the medium term connected oil volume rules 512 includes medium term connected oil volume (MTCOV) and medium term connected oil volume uncertainty (MTCOVU). The medium term connected oil volume rules 512 includes a set of more or more of the rules corresponding to these inputs. In one implementation, the rules include, without limitation: a first rule that if MTCOV is high and MTCOVU is low, then Medium Term Connected Oil Volume is high; a second rule that if MTCOV is high and MTCOVU is medium, then Medium Term Connected Oil Volume is medium; a third rule that if MTCOV is medium and MTCOVU is low, then Connected Oil Volume is medium; and a fourth rule that if MTCOV is medium and MTCOVU is high, then Medium Term Connected Oil Volume is low. It will be appreciated that more, fewer, and/or different inputs and/or rules may be utilized. The medium term connected oil volume rules 512 are aggregated into the score 320 and the output 322 is an intermediary output of output medium term connected oil volume with a value quantified between 0-1.

Similarly, the input set 300 corresponding to the short term connected oil volume rules 514 includes short term connected oil volume (STCOV) and short term connected oil volume uncertainty (STCOVU). The short term connected oil volume rules 514 includes a set of more or more of the rules corresponding to these inputs. In one implementation, the rules include, without limitation: a first rule that if STCOV is high and STCOVU is low, then Short Term Connected Oil Volume is high; a second rule that if STCOV is high and STCOVU is medium, then Short Term Connected Oil Volume is medium; a third rule that if STCOV is medium and STCOVU is low, then Short Connected Oil Volume is medium; and a fourth rule that if STCOV is medium and STCOVU is high, then Short Term Connected Oil Volume is low. It will be appreciated that more, fewer, and/or different inputs and/or rules may be utilized. The short term connected oil volume rules 514 are aggregated into the score 320 and the output 322 is an intermediary output of output short term connected oil volume with a value quantified between 0-1.

At a second stage of fuzzy inference, the input set 300 corresponding to the connected oil volume (COV) rules 516 includes long term connected oil volume (LTCOV), medium term connected oil volume (MTCOV), and short term connected oil volume (STCOV) obtained from the first stage of fuzzy inference using the rules 510-514. The connected oil volume rules 516 includes a set of more or more of the rules corresponding to these inputs. In one implementation, the rules include, without limitation: a first rule that if STCOV is high and MTCOV is high and LTCOV is high, then COV is high; a second rule that if STCOV is high and MTCOV is high and LTCOV is medium, then COV is high; a third rule that if STCOV is high and MTCOV is high and LTCOV is low, then COV is low; a fourth rule that if STCOV is high and MTCOV is medium and LTCOV is high, then COV is medium; a fifth rule that if STCOV is high and MTCOV is low and LTCOV is high, then COV is medium; a sixth rule that if STCOV is low and MTCOV is high and LTCOV is high, then COV is medium; and a seventh rule that if STCOV is low and MTCOV is medium and LTCOV is high, then COV is low. It will be appreciated that more, fewer, and/or different inputs and/or rules may be utilized. The connected oil volume rules 516 are aggregated into the score 320 and the output 322 is an intermediary output of output connected oil volume with a value quantified between 0-1.

In one implementation, at a first stage of fuzzy inference, the input set 300 corresponding to the nearby faults rules 518 includes a number of nearby faults (NFN), an average transmissibility of nearby faults (NFT), and an average confidence of nearby faults (NFC). The nearby faults rules 518 includes a set of more or more of the rules corresponding to these inputs. In one implementation, the rules include, without limitation: a first rule that if NFN is high and NFT is low and NFC is high, then Nearby Faults is high; a second rule that if NFN is high and NFT is low and NFC is medium, then Nearby Faults is medium; a third rule that if NFT is high, then Nearby Faults is low; a fourth rule that if NFC is low, then Nearby Faults is low; and a fifth rule that if NFN is high and NFT is high and NFC is medium, then Nearby Faults is low. It will be appreciated that more, fewer, and/or different inputs and/or rules may be utilized. The nearby faults rules 518 are aggregated into the score 320 and the output 322 is an intermediary output of output nearby faults with a value quantified between 0-1.

The input set 300 corresponding to the midway faults rules 520 includes a number of midway faults (MFN), an average transmissibility of midway faults (MFT), and an average confidence of midway faults (MFC). The midway faults rules 520 includes a set of more or more of the rules corresponding to these inputs. In one implementation, the rules include, without limitation: a first rule that if MFN is high and MFT is low and MFC is high, then Midway Faults is high; a second rule that if MFN is high and MFT is low and MFC is medium, then Midway Faults is medium; a third rule that if MFT is high, then Midway Faults is low; a fourth rule that if MFC is low, then Midway Faults is low; and a fifth rule that if MFN is high and MFT is high and MFC is medium, then Midway Faults is low. It will be appreciated that more, fewer, and/or different inputs and/or rules may be utilized. The midway faults rules 520 are aggregated into the score 320 and the output 322 is an intermediary output of output midway faults with a value quantified between 0-1.

The input set 300 corresponding to the distance faults rules 522 includes a number of distant faults (DFN), an average transmissibility of distant faults (DFT), and an average confidence of distant faults (DFC). The distant faults rules 522 includes a set of more or more of the rules corresponding to these inputs. In one implementation, the rules include, without limitation: a first rule that if DFN is high and DFT is low and DFC is high, then Distant Faults is high; a second rule that if DFN is high and DFT is low and DFC is medium, then Distant Faults is medium; a third rule that if DFT is high, then Distant Faults is low; a fourth rule that if DFC is low, then Distant Faults is low; and a fifth rule that if DFN is high and DFT is high and DFC is medium, then Distant Faults is low. It will be appreciated that more, fewer, and/or different inputs and/or rules may be utilized. The distant faults rules 522 are aggregated into the score 320 and the output 322 is an intermediary output of output distant faults with a value quantified between 0-1.

At a second stage of fuzzy inference, the input set 300 corresponding to the fault rules 524 includes nearby faults (NF), midway faults (MF), and distant faults (DF) obtained from the first stage of fuzzy inference using the rules 518-522. The fault rules 524 includes a set of more or more of the rules corresponding to these inputs. In one implementation, the rules include, without limitation: a first rule that if NF is high and MF is high and DF is high, then Fault is high; a second rule that if NF is high, then Fault is high; a third rule that if NF is low and MF is high and DF is high, then Fault is low; a fourth rule that if NF is medium and MF is high and DF is high, then Fault is medium; and a fifth rule that if NF is low and MF is low and DF is low, then Fault is low. It will be appreciated that more, fewer, and/or different inputs and/or rules may be utilized. The fault rules 524 are aggregated into the score 320 and the output 322 is an intermediary output of output faults with a value quantified between 0-1.

In one implementation, at a first stage of fuzzy inference, the input set 300 corresponding to the short term connected water volume rules 526 includes short term connected water volume (STCWV) and short term connected water volume uncertainty (STCWVU). The short term connected water volume rules 526 includes a set of more or more of the rules corresponding to these inputs. In one implementation, the rules include, without limitation: a first rule that if STCWV is high and STCWVU is low, then Short Term Connected Water Volume is high; a second rule that if STCWV is high and STCWVU is medium, then Short Term Connected Water Volume is medium; a third rule that if STCWV is medium and STCWVU is low, then Short Term Connected Water Volume is medium; and a fourth rule that if STCWV is medium and STCWVU is high, then Short Term Connected Water Volume is low. It will be appreciated that more, fewer, and/or different inputs and/or rules may be utilized. The short term connected water volume rules 526 are aggregated into the score 320 and the output 322 is an intermediary output of output short term connected water volume with a value quantified between 0-1.

Similarly, the input set 300 corresponding to the medium term connected water volume rules 528 includes medium term connected water volume (MTCWV) and medium term connected water volume uncertainty (MTCWVU). The medium term connected water volume rules 528 includes a set of more or more of the rules corresponding to these inputs. In one implementation, the rules include, without limitation: a first rule that if MTCWV is high and MTCWVU is low, then Medium Term Connected Water Volume is high; a second rule that if MTCWV is high and MTCWVU is medium, then Medium Term Connected Water Volume is medium; a third rule that if MTCWV is medium and MTCWVU is low, then Medium Term Connected Water Volume is medium; and a fourth rule that if MTCWV is medium and MTCWVU is high, then Medium Term Connected Water Volume is low. It will be appreciated that more, fewer, and/or different inputs and/or rules may be utilized. The medium term connected water volume rules 528 are aggregated into the score 320 and the output 322 is an intermediary output of output medium term connected water volume with a value quantified between 0-1.

At a second stage of fuzzy inference, the input set 300 corresponding to the connected water volume rules 530 includes short term connected water volume (STCWV) and medium term connected water volume (MTCWV) obtained from the first stage of fuzzy inference using the rules 526-528. The connected water volume rules 530 includes a set of more or more of the rules corresponding to these inputs. In one implementation, the rules include, without limitation: a first rule that if STCVW is high and MTCWV is high, then CWV is high; a second rule that if STCVW is high and MTCWV is medium, then CWV is high; a third rule that if STCVW is high and MTCWV is low, then CWV is medium; a fourth rule that if STCVW is medium and MTCWV is high, then CWV is high; a fifth rule that if STCVW is low and MTCWV is high, then CWV is medium; a sixth rule that if STCVW is low and MTCWV is medium, then CWV is medium; and a seventh rule that if STCVW is low and MTCWV is low, then CWV is low. It will be appreciated that more, fewer, and/or different inputs and/or rules may be utilized. The connected water volume rules 530 are aggregated into the score 320 and the output 322 is an intermediary output of output connected water volume with a value quantified between 0-1.

At a third stage of fuzzy interference, the input set 300 corresponding to the drill rules 532 includes energy (E), faults (F), interfering wells (IW), connected oil volume (COV), transmissibility (T), and static property confidence (SPC) obtained from the second stage of fuzzy inference. The drill rules 532 includes a set of more or more of the rules corresponding to these inputs. In one implementation, the rules include, without limitation: a first rule that if E is high and Faults is low and COV is high, then drill attractiveness is high; a second rule that if E is high and COV is high and SPC is high, then drill attractiveness is very high; a third rule that if E is medium and F is low and COV is medium, then drill attractiveness is medium; and a fourth rule that if COV is low, then drill attractiveness is very low. It will be appreciated that more, fewer, and/or different inputs and/or rules may be utilized. The drill rules 532 are aggregated into the score 320 and the output 322 is a final output of output drill attractiveness with a value quantified between 0-1. All the inputs and rules described with respect to FIGS. 4 and 5 are exemplary only and are not intended to be limiting.

Figure 6:
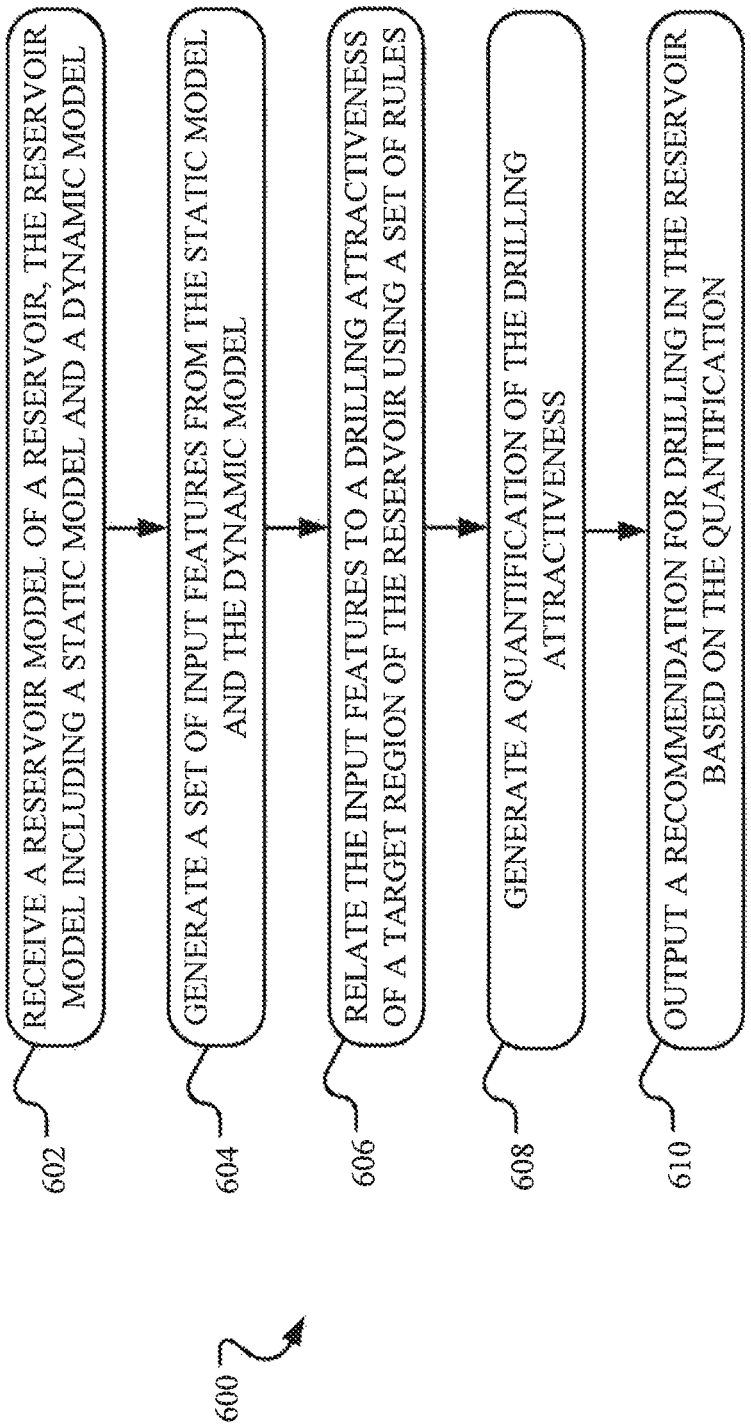
FIG. 6 illustrates example operations for reservoir development.

Referring to FIG. 6, example operations 600 for reservoir development are illustrated. In one implementation, an operation 602 receives a reservoir model of the reservoir. The reservoir model includes a static model and a dynamic model. The static model including one or more clusters of a three-dimensional volume of the reservoir and an uncertainty quantification generated using a neural network. The dynamic model includes pressure values and fluid saturation values propagated across the three-dimensional volume through a nodal connectivity of neighboring clusters. An operation 604 generates a set of one or more input features from the static model and the dynamic model. An operation 606 relates the set of one or more input features to a drilling attractiveness of a target region of the reservoir using a set of one or more rules. An operation 608 generates a quantification of the drilling attractiveness, and an operation 610 outputs a recommendation for drilling in the reservoir based on the quantification of the drilling attractiveness.

Figure 7:
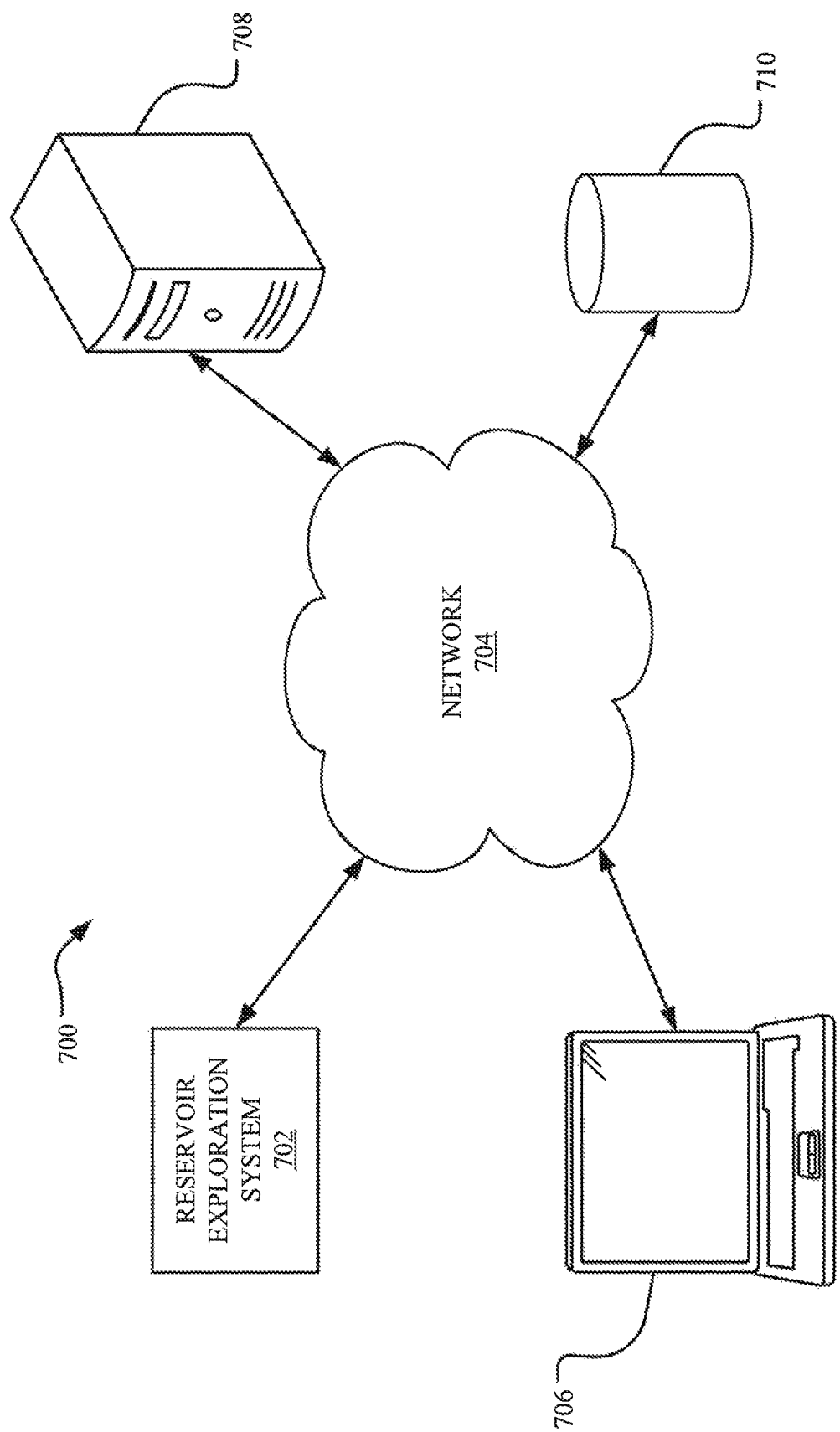
FIG. 7 shows an example network environment that may implement various systems and methods discussed herein.

For a detailed description of an example network environment 700 for reservoir development, reference is made to FIG. 7. In one implementation, a user, such as a member of the interprofessional team, accesses and interacts with a reservoir development system 702 using a user device 706 to access, generate, or otherwise interact with reservoir models, recommendations, underlying data, and/or other information via a network 704. The reservoir development system 702 may incorporate some or all or some of the features of the reservoir development system 100 described herein.

The user device 706 is generally any form of computing device capable of interacting with the network 704, such as a personal computer, terminal, workstation, desktop computer, portable computer, mobile device, smartphone, tablet, multimedia console, etc. The network 704 is used by one or more computing or data storage devices (e.g., one or more databases 710 or other computing units described herein) for implementing the reservoir development system 702 and other services, applications, or modules in the network environment 700. The reservoir data, the expert data, rules, features, reservoir models, recommendations, software, and other information utilized by the reservoir development system 702 may be stored in and accessed from the one or more databases 710.

In one implementation, the network environment 700 includes at least one server 708 hosting a website or an application that the user may visit to access the reservoir development system 702 and/or other network components. The server 708 may be a single server, a plurality of servers with each such server being a physical server or a virtual machine, or a collection of both physical servers and virtual machines. In another implementation, a cloud hosts one or more components of the network environment 700. The user devices 706, the server 708, and other resources connected to the network 704 may access one or more other servers to access to one or more websites, applications, web services interfaces, storage devices, computing devices, or the like that are used for reservoir characterization, exploration, development, and production. The server 708 may also host a search engine that the reservoir development system 702 uses for accessing, searching for, and modifying reservoir models, recommendations, underlying data, and other data, as well as for providing reservoir characterization, development, and production services, as described herein.

Figure 8:
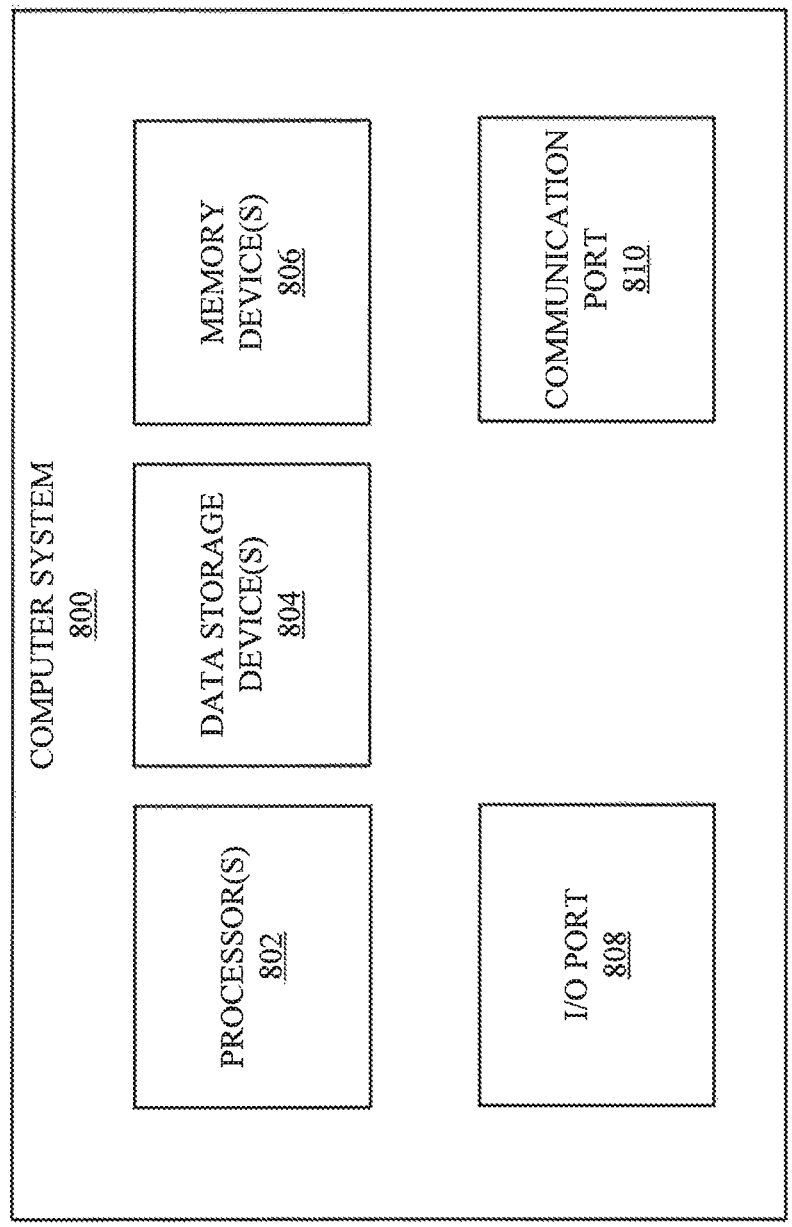
FIG. 8 is an example computing system that may implement various systems and methods discussed herein.

Referring to FIG. 8, a detailed description of an example computing system 800 having one or more computing units that may implement various systems and methods discussed herein is provided. The computing system 800 may be applicable to the reservoir development system 100, the static modeler 102, the dynamic modeler 104, the reasoner 106, the user devices 706, the reservoir development system 702, and other computing or network devices. It will be appreciated that specific implementations of these devices may be of differing possible specific computing architectures not all of which are specifically discussed herein but will be understood by those of ordinary skill in the art.

The computer system 800 may be a computing system is capable of executing a computer program product to execute a computer process. Data and program files may be input to the computer system 800, which reads the files and executes the programs therein. Some of the elements of the computer system 800 are shown in FIG. 8, including one or more hardware processors 802, one or more data storage devices 804, one or more memory devices 808, and/or one or more ports 808-810. Additionally, other elements that will be recognized by those skilled in the art may be included in the computing system 800 but are not explicitly depicted in FIG. 8 or discussed further herein. Various elements of the computer system 800 may communicate with one another by way of one or more communication buses, point-to-point communication paths, or other communication means not explicitly depicted in FIG. 8.

The processor 802 may include, for example, a central processing unit (CPU), a microprocessor, a microcontroller, a digital signal processor (DSP), and/or one or more internal levels of cache. There may be one or more processors 802, such that the processor 802 comprises a single central-processing unit, or a plurality of processing units capable of executing instructions and performing operations in parallel with each other, commonly referred to as a parallel processing environment.

The computer system 800 may be a conventional computer, a distributed computer, or any other type of computer, such as one or more external computers made available via a cloud computing architecture. The presently described technology is optionally implemented in software stored on the data stored device(s) 804, stored on the memory device(s) 806, and/or communicated via one or more of the ports 808-810, thereby transforming the computer system 800 in FIG. 8 to a special purpose machine for implementing the operations described herein. Examples of the computer system 800 include personal computers, terminals, workstations, mobile phones, tablets, laptops, personal computers, multimedia consoles, gaming consoles, set top boxes, and the like.

The one or more data storage devices 804 may include any non-volatile data storage device capable of storing data generated or employed within the computing system 800, such as computer executable instructions for performing a computer process, which may include instructions of both application programs and an operating system (OS) that manages the various components of the computing system 800. The data storage devices 804 may include, without limitation, magnetic disk drives, optical disk drives, solid state drives (SSDs), flash drives, and the like. The data storage devices 804 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 806 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 804 and/or the memory devices 806, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 800 includes one or more ports, such as an input/output (I/O) port 808 and a communication port 810, for communicating with other computing, network, or vehicle devices. It will be appreciated that the ports 808-810 may be combined or separate and that more or fewer ports may be included in the computer system 800.

The I/O port 808 may be connected to an I/O device, or other device, by which information is input to or output from the computing system 800. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 800 via the I/O port 808. Similarly, the output devices may convert electrical signals received from computing system 800 via the I/O port 808 into signals that may be sensed as output by a human, such as sound, light, and/or touch. The input device may be an alphanumeric input device, including alphanumeric and other keys for communicating information and/or command selections to the processor 802 via the I/O port 808. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 800 via the I/O port 808. For example, an electrical signal generated within the computing system 800 may be converted to another type of signal, and/or vice-versa. In one implementation, the environment transducer devices sense characteristics or aspects of an environment local to or remote from the computing device 800, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 800, such as, physical movement of some object (e.g., a mechanical actuator), heating or cooling of a substance, adding a chemical substance, and/or the like.

In one implementation, a communication port 810 is connected to a network by way of which the computer system 800 may receive network data useful in executing the methods and systems set out herein as well as transmitting information and network configuration changes determined thereby. Stated differently, the communication port 810 connects the computer system 800 to one or more communication interface devices configured to transmit and/or receive information between the computing system 800 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 810 to communicate one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 810 may communicate with an antenna or other link for electromagnetic signal transmission and/or reception.

In an example implementation, reservoir data, expert data, rules, features, reservoir models, recommendations, audit trails, software and other modules and services may be embodied by instructions stored on the data storage devices 804 and/or the memory devices 806 and executed by the processor 802.

The system set forth in FIG. 8 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for developing reservoir recommendations, the method comprising:
   receiving a reservoir model of a reservoir at a fuzzy inference engine, the reservoir model including a static model and a dynamic model, the static model including one or more clusters of a three-dimensional volume of the reservoir and an uncertainty quantification generated using a neural network, the dynamic model including pressure values and fluid saturation values propagated across the three-dimensional volume through a nodal connectivity of neighboring clusters;
   generating a set of input features from the static model and the dynamic model associated with a target region of the reservoir via the fuzzy inference engine;
   determining a drilling attractiveness of the target region of the reservoir based on the set of input features and using two or more fuzzy inference stages, each stage associated with a set of one or more rules, wherein an output of each stage is an intermediary value or a final value;
   determining a ranking of the target region based on the final value output; and
   outputting a recommendation for drilling in the reservoir, wherein the recommendation includes a list of ranked potential regions including the ranked target region.

2. The method of claim 1, wherein the recommendation includes an audit trail detailing how the ranking of the target region was generated.

3. The method of claim 1, wherein the set of input features is related to the drilling attractiveness of the target region through a plurality of stages of fuzzy inference.

4. The method of claim 1, wherein the recommendation is automatically updated in response to any change to at least one of the static model, the dynamic model, the set of input features, or the set of one or more rules.

5. The method of claim 1, wherein the set of one or more rules includes one or more of energy rules, fault rules, interfering well rules, connected oil volume rules, and drilling rules.

6. The method of claim 5, wherein at least one of the energy rules, the fault rules, the interfering well rules, the connected oil volume rules, or the drilling rules is obtained through a plurality of stages of fuzzy inference.

7. One or more non-transitory tangible computer-readable storage media storing computer-executable instructions for performing a computer process on a computing system, the computer process comprising:
   receiving a reservoir model of a reservoir at a fuzzy inference engine, the reservoir model including a static model and a dynamic model, the static model including one or more clusters of a three-dimensional volume of the reservoir and an uncertainty quantification generated using a neural network, the dynamic model including pressure values and fluid saturation values propagated across the three-dimensional volume through a nodal connectivity of neighboring clusters;
   generating a set of input features from the static model and the dynamic model associated with a target region of the reservoir via the fuzzy inference engine;
   determining a drilling attractiveness of the target region of the reservoir based on the set of input features and using two or more fuzzy inference stages, each stage associated with a set of one or more rules, wherein an output of each stage is an intermediary value or a final value;
   determining a ranking of the target region based on the final value output; and
   outputting a recommendation for drilling in the reservoir, wherein the recommendation includes a list of ranked potential regions including the ranked target region.

8. The one or more non-transitory tangible computer-readable storage media of claim 7, wherein the recommendation includes an audit trail detailing how the ranking of the target region was generated.

9. The one or more non-transitory tangible computer-readable storage media of claim 7, wherein the set of input features is related to the drilling attractiveness of the target region through a plurality of stages of fuzzy inference.

10. The one or more non-transitory tangible computer-readable storage media of claim 7, wherein the recommendation is automatically updated in response to any change to at least one of the static model or the dynamic model.

11. The one or more non-transitory tangible computer-readable storage media of claim 7, wherein the set of one or more rules includes one or more of energy rules, fault rules, interfering well rules, connected oil volume rules, and drilling rules.

12. The one or more non-transitory tangible computer-readable storage media of claim 11, wherein at least one of the energy rules, the fault rules, the interfering well rules, the connected oil volume rules, or the drilling rules is obtained through a plurality of stages of fuzzy inference.

13. A system for developing reservoir recommendations, the system comprising:
    a static modeler generating a static model of a reservoir, the static model including one or more clusters of a three-dimensional volume of the reservoir and an uncertainty quantification generated using a neural network;
    a dynamic modeler generating a dynamic model of the reservoir including pressure values and fluid saturation values propagated across the three-dimensional volume through a nodal connectivity of neighboring clusters; and
    a fuzzy inference engine in communication with the static modeler and the dynamic modeler, the fuzzy inference engine:
        generating a set of input features from the static model and the dynamic model associated with a target region of the reservoir;
        determining a drilling attractiveness of the target region of the reservoir based on the set of input features and using two or more fuzzy inference stages, each stage associated with a set of one or more rules, wherein an output of each stage is an intermediary value or a final value;
        determining a ranking of the target region based on the final value output; and
        outputting a recommendation for drilling in the reservoir, wherein the recommendation includes a list of ranked potential regions including the ranked target region.

14. The system of claim 13, wherein the recommendation includes an audit trail detailing how the ranking of the target region was generated.

15. The system of claim 13 wherein the set of input features is related to the drilling attractiveness of the target region through a plurality of stages of fuzzy inference.

16. The system of claim 13, wherein the recommendation is automatically updated in response to any change to at least one of the static model or the dynamic model.

17. The system of claim 13, wherein the recommendation is output for presentation with a user device.

* * * * *